United States Patent [19]

Kato et al.

[11] Patent Number: 4,580,126

[45] Date of Patent: Apr. 1, 1986

[54] METHOD OF TESTING ANALOG/DIGITAL CONVERTER AND STRUCTURE OF ANALOG/DIGITAL CONVERTER SUITED FOR THE TEST

[75] Inventors: Kazuo Kato, Ibaraki; Takeshi Hirayama, Mito; Shigeaki Yoshida, Sayama; Yoshinori Sato, Mitaka, all of Japan

[73] Assignee: Hitachi, Ltd., Tokyo, Japan

[21] Appl. No.: 669,349

[22] Filed: Nov. 8, 1984

Related U.S. Application Data

[63] Continuation of Ser. No. 338,866, Jan. 12, 1982.

[30] Foreign Application Priority Data

Jan. 19, 1981 [JP] Japan .................................. 56-5011

[51] Int. Cl.$^4$ ............................................ H03K 13/08
[52] U.S. Cl. ...................... 340/347 AD; 340/347 CC; 340/347 M
[58] Field of Search .... 340/347 AD, 347 M, 347 CC; 324/73 R, 130

[56] References Cited

PUBLICATIONS

Naylor, Testing Digital/Analog and Analog/Digital Converters, IEEE Transactions on Circuits and Systems, No. 7, vol. CAS-25, pp. 526-538.
The Engineering Staff of Analog Devices, Inc., Analog-Digital Conversion Handbook, 6/1972, pp. I-1 to I-11; II-46 to II-48; II-80 to II-87; and II-102 to II-111.

Primary Examiner—T. J. Sloyan
Attorney, Agent, or Firm—Antonelli, Terry & Wands

[57] ABSTRACT

A method of testing a successive comparison type analog/digital converter which incorporates a voltage comparator, a register for successive comparison and a digital/analog converter. A reference digital signal is inputted to the incorporated digital/analog comparator to be converted into an analog signal, while a digital signal corresponding to the reference digital signal is inputted to an externally provided reference digital/analog converter to be converted into an analog signal. Both analog signals thus produced are compared with each other through the incorporated voltage comparator to thereby determine conversion accuracy. A successive comparison type analog/digital converter suited for the test includes further a change-over switch for introducing the externally supplied digital signal to the incorporated digital/analog converter and a change-over switch for leading outwardly the output signal from the voltage comparator.

10 Claims, 6 Drawing Figures

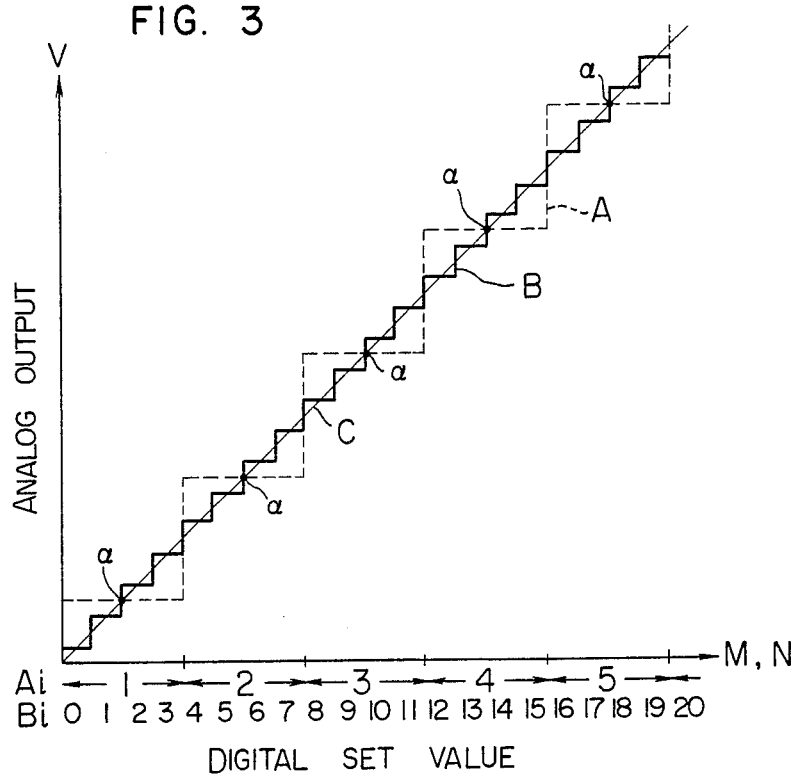
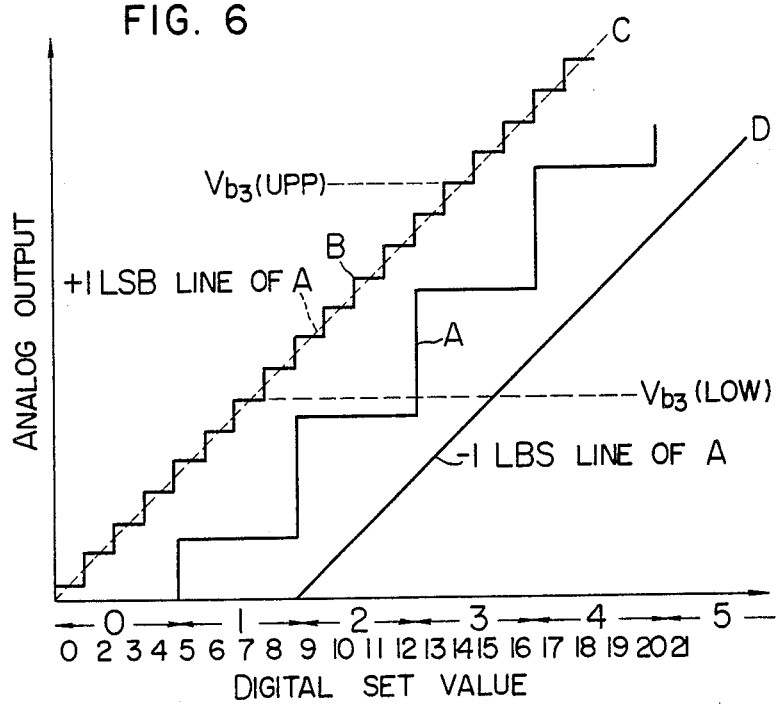

METHOD OF TESTING ANALOG/DIGITAL CONVERTER AND STRUCTURE OF ANALOG/DIGITAL CONVERTER SUITED FOR THE TEST

This is a continuation of application Ser. No. 338,866 filed Jan. 12, 1982.

BACKGROUND OF THE INVENTION

The present invention relates generally to a method of testing an analog-to-digital converter (hereinafter referred to also as A/D converter or analog/digital converter). More particularly, the invention concerns a method of testing an A/D converter of the successive comparison type, as well as a structure of the A/D converter which is suited for application of the testing method.

In general, an A/D converter of the successive comparison type incorporates therein a digital-to-analog converter (hereinafter referred to also as D/A converter or digital/analog converter), a voltage comparator and a register for successive comparison. The precision of conversion or the conversion accuracy of such A/D converter has been measured heretofore through an analog measuring method or digital measuring method. According to the analog measuring method, a steadily increasing input voltage is applied to the A/D converter under test to be converted into a digital signal which is then restored to an analog signal by means of a reference D/A converter exhibiting accurate conversion characteristics. The restored or regenerated analog voltage is compared with the input voltage, to detect a possible difference on the basis of which the conversion characteristic of the A/D converter under test is determined. On the other hand, in the case of the digital measurement test, a digital set value is converted into an analog voltage through a reference D/A converter, which analog voltage is again converted into a digital signal through the A/D converter under test. The digital signal thus obtained is then compared with the original digital set value for determining the conversion accuracy of the A/D converter under test. The reference D/A converter employed in these testing methods should of course exhibit a sufficiently high conversion accuracy as compared with that of the D/A converter to be tested, in order to attain a high accuracy in the resultant measurement, which in turn means that a lot of time is required for the measurement or test, which is a disadvantage.

For example, when a 10-bit A/D converter is to be tested by using a reference D/A converter of 14-bit length according to the hitherto known measuring or testing method, the measurements will have to be repeated $2^{14}(=16,384)$ times by varying the input level to the 10-bit A/D converter under test, in order to effect the measurement or test over the whole input range. In this manner, the measurement of the conversion accuracy of the A/D converter with a reasonably high precision or accuracy requires an intolerably long time, involving high expenditure of effort for the test, while the measurement accuracy may be statistically degraded due to various influences such as externally applied noise.

Further, it should be mentioned that the hitherto known testing method requires a voltage comparator in addition to external measuring devices such as, for example, a computer and the reference D/A converter.

As the other prior art, conventional analog or digital measuring methods are disclosed in "Testing Digital-/Analog And Analog/Digital Converters", Jim R. Naylor, IEEE Transactions on Circuits and Systems, Vol. CAS-25, No. 7, July 1978.

SUMMARY OF THE INVENTION

An object of the present invention is to privide a method of testing a digital/analog converter of the successive comparison type, which method allows the conversion accuracy to be determined with a high precision within a short time. In this regard, it is also contemplated with the invention to provide an analog/digital converter of the successive comparison type which has a structure suited for application of the testing method mentioned above.

Another object of the present invention is to provide a method of testing an analog/digital converter without suffering the drawbacks of the hitherto known methods described hereinbefore, and to provide an analog/digital converter of the successive comparison type having a structure suited for application of the testing method.

A method of testing an analog/digital converter is characterized in that a digital signal is converted into an analog voltage signal through use of a digital/analog converter of the successive comparison type analog/digital converter to be tested, a digital signal which corresponds to the above mentioned digital signal is converted into an analog signal through use of a reference digital/analog converter, and that both the analog signals thus obtained after the respective conversions are compared with each other by using a voltage comparator incorporated in the analog/digital converter under test. An analog/digital converter of the successive comparison type suited for application of the testing method described above is characterized by means for inputting a digital signal to the digital/analog converter, means for introducing the analog voltage signal outputted from the digital/analog converter to a voltage comparator, means for introducing the analog voltage signal outputted from an external reference digital-/analog converter to the voltage comparator, and means for outputting the result of comparison obtained from the voltage comparator.

BRIEF DESCRIPTION OF THE DRAWINGS

FIG. 3 graphically illustrates the relation between digital set values and analog outputs for illustrating the principle of the testing method according to the invention.

FIG. 6 graphically illustrates another process of measuring the conversion accuracy or precision by making use of the method of testing an analog/digital converter according to the invention.

DETAILED DESCRIPTION OF PREFERRED EMBODIMENTS

The principle of the present invention is based on the fact that the conversion time, i.e. the time required for digital to analog conversion, of a digital-to-analog converter (hereinafter referred to as D/A converter) such as the one incorporated in an analog-to-digital converter (hereinafter referred to as A/D converter) of the successive comparison type is in general extremely short as compared with the conversion time of the usual A/D converter.

Figure 1:
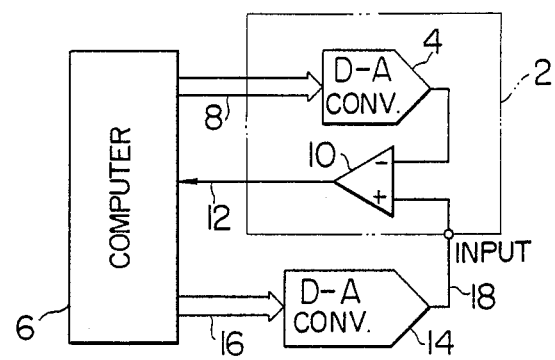
FIG. 1 is a block diagram to illustrate a method of testing an analog/digital converter according to the invention.

Referring to FIG. 1, for carrying out a testing method of an A/D converter of the successive comparison type according to the present invention, an input terminal of a D/A converter 4 incorporated in an A/D converter 2 to be tested is connected to receive a digital input code outputted from a computer 6 externally provided for performing measurements through an input signal line 8. The analog output of this D/A converter 4 is introduced to a negative input terminal of a voltage comparator 10 which is also incorporated in the A/D converter 2 to be tested. The output signal of the voltage comparator 10 is applied to the external computer 6 through a signal line 12.

There is additionally provided a standard or reference D/A converter 14 having an input terminal which is supplied with a digital input signal from the external computer 6 through an input signal line 16. The analog output signal of the reference D/A converter 14 is supplied to a positive input terminal of the voltage comparator 10 contained in the A/D converter 2 to be tested. In this connection, it should be mentioned that the number of input bits to the reference D/A converter 14 is larger than that applied to the D/A converter 4 incorporated in the successive comparison type A/D converter 2 to be tested.

With the circuit arrangement described above, the converted analog signal outputted from the reference D/A converter 14 is compared with the converted analog signal outputted from the D/A converter 4 incorporated in the A/D converter 2 under test by means of the voltage comparator 10 also incorporated in the A/D converter 2 under test. In this way, according to the testing method of the invention, measurement is made for the errors which are ascribable to both the D/A converter 4 and the voltage comparator 10 constituting the main parts of the successive comparison type A/D converter 2 and which provide primary causes for the errors involved in the output characteristics of the latter.

Needless to say, the A/D converter is generally provided with an analog signal input terminal and a digital signal output terminal in addition to a power source connection terminal. However, in the case of the A/D converter 2 the conversion accuracy of which is to be tested according to the testing procedure taught by the present invention, it is necessary to provide means for inputting a digital signal to the incorporated D/A converter 4 as well as means for leading the output signal produced by the incorporated voltage comparator 10 to the exterior.

Figure 2:
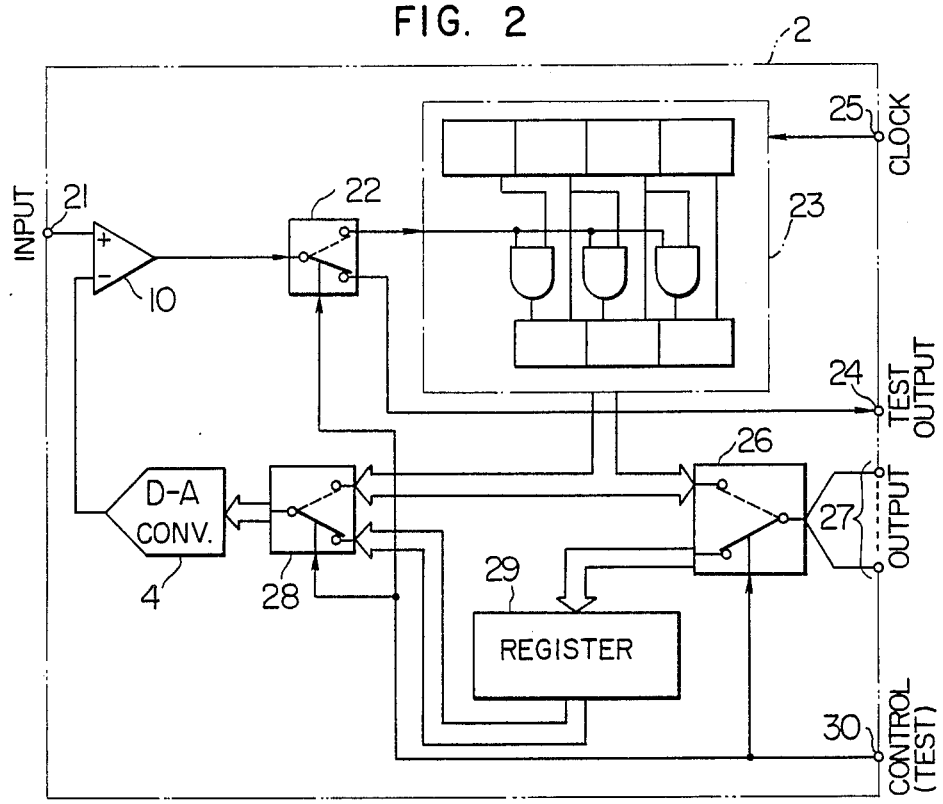
FIG. 2 shows in a block diagram a circuit arrangement of an analog/digital converter having a structure suited for measurement of the conversion accuracy thereof by applying the method of testing the analog/-digital converter according to the invention.

An exemplary embodiment of the successive comparison type A/D converter of a structure suited for the test according to the testing procedure of the present invention is shown in detail in FIG. 2, in which the same reference numerals as used in FIG. 1 denote equivalent or the same elements as those shown in FIG. 1.

Referring to FIG. 2, the A/D converter 2 of the successive comparison type has an input terminal 21 for an analog input signal. This terminal 21 is connected to a positive input terminal of the voltage comparator 10 whose output terminal is adapted to be connected to either a register 23 for successive comparison or an output terminal 24 labelled "TEST OUTPUT" through a change-over switch 22. The successive comparison register 23 has a clock input terminal which is connected to an input terminal 25 labelled "CLOCK" in the figure.

The register 23 for successive comparison is generally constituted by counters, AND gates and registers in a number corresponding to the number of bits to be processed, although the register circuit 23 is illustrated in FIG. 2 in a much simplified configuration. The digital output of the successive comparison register 23 is on one hand connected to a digital output terminal array 27 labelled "OUTPUT" and including a number of individual terminals corresponding to the number of bits of said digital output signal through a change-over switch 26 and on the other hand is connected to the input terminal of the D/A converter 4 by way of another change-over switch 28. The output terminal of the D/A converter 4 is connected to the negative input terminal of the voltage comparator 10. A register 29 is interposed between the change-over switches 26 and 28. The control inputs of the three change-over switches 22, 26 and 28 are coupled to an input terminal 30 labelled "CONTROL (TEST)" in FIG. 2.

The successive comparison type A/D converter 2 of the structure described above has two types of operation modes, i.e. A/D conversion mode and test mode.

In the first place, the operation of the A/D converter 2 in the A/D conversion mode will be explained. In this A/D conversion mode, the three change-over switches 22, 26 and 28 mentioned above are switched to the respective positions indicated by broken lines in response to a control signal applied to the input terminal 30 for mode selection. In this state, the analog signal applied to the input terminal 21 and the output signal from the D/A converter 4 are supplied to the positive and the negative input terminals of the voltage comparator 10, respectively. The successive comparison register 23 increments successively the value of the digital output signal thereof in response to the input signal representative of the comparison result derived from the voltage comparator 10 through the change-over switch 22. More specifically, so long as the analog input signal applied to the input terminal 21 is greater than the analog output signal from the D/A converter 4, the digital output signal from the successive comparison register 23 is increased successively by one increment, whereby the digital output signal corresponding to the analog input signal is supplied to the output terminal array 27. This operation will continue until the relation between the analog input signal and the output signal from the D/A converter 4 mentioned above is reversed.

In the case of the test mode operation, the three change-over switches 22, 26 and 28 are switched to the respective positions indicated by solid lines in response to the test mode selecting control signal applied to the terminal 30. In this state, a digital signal supplied from an externally provided computer (corresponding to the one denoted by the reference numeral 6) is applied to the output terminal array 27 and hence furnished to the D/A converter 4 through the register 29. On the other hand, an analog signal supplied from a standard or reference D/A converter (corresponding to the one denoted by 14 in FIG. 1) is applied to the input terminal 21 and hence to the positive input terminal of the voltage comparator 10, while the negative input terminal thereof receives the analog output signal from the D/A converter 4. The output signal from the voltage comparator 10 is applied to the external measurement processing computer (denoted by the numeral 6 in FIG. 1) through the change-over switch 22 and the output terminal 24.

FIG. 3 graphically illustrates input/output characteristics of the D/A converter 4 incorporated in the A/D converter 2 to be tested and the reference D/A converter 14. In the figure, a broken-line stepped curve A represents the conversion characteristic of the D/A converter 4 incorporated in the A/D converter 2 to be tested, while a solid line stepped curve B represents conversion characteristic of the reference D/A converter 14 and a straight line C represents an ideal conversion characteristic. As can be seen from the characteristic curve A of the D/A converter 4 incorporated in the A/D converter 2 to be tested, the least significant bit of the digital input signal is usually imparted with a weight corresponding to a half of a unit quantity so that zero offset is not produced relative to the straight line C which represents the ideal conversion characteristic. As the consequence, the first analog output is of a mangitude equal to a half of the unit quantity and the succeeding outputs increase successively by the unit quantity to thereby take a step-like rising waveform. On the other hand, the reference D/A converter 14 is imparted with an offset corresponding to a half bit so as to comply with the ideal straight line characteristic C in view of the fact that the increments in the analog output of the reference D/A converter 14 for responding to the digital input signal remain thoroughly constant. In practice, such imparting of the offset may be effected, for example, by using as the reference D/A converter 14 a converter which has a bit capacity greater by one bit than the number of bits used in the test or measurement, wherein the least significant bit is always fixed to "1" or alternatively by adding a magnitude corresponding to a half bit through an additional analog means, although not illustrated in the drawings. However, when the bit number of the standard or reference D/A converter 14 is sufficiently large over the bit number of an A/D converter 2 to be tested, the biasing of the reference D/A converter 14 in the sense mentioned above can be omitted.

In the ideal case where no errors are involved in the operations of both the D/A converters 4 and 14 and the voltage comparator 10, it is obvious that the detection output voltage signals (i.e. comparison result signals) of the voltage comparator 10 produced in response to the digital set values $A_i$ of the D/A converter 4 to be tested and the digital set values $B_i$ of the reference D/A converter 14 correspond to levels represented by points $\alpha$ in FIG. 3. Accordingly, it is sufficient to detect deviations of the signal obtained from the actual A/D conversion relative to the set points $\alpha$ of the ideal conversion characteristic at which the conversion characteristic curve A of the D/A converter 4 should ideally intersect the ideal characteristic curve C. More specifically, assuming that the resolution of the reference D/A converter 14 is higher than that of the D/A converter 4 to be tested by two bits, the digital set input value $B_i$ of the reference D/A converter 14 which corresponds to the i-th set value $A_i$ of the D/A converter 4 to be tested is given by $B_i = 4A_i - 2$, provided that no error is present. Accordingly, when a deviation or difference is found between the ideal value of $B_i$ and the corresponding set value $B_i$ for which the output signal of the voltage comparator is inverted in response to the concurrent set value of $A_i$, such deviation or difference may be regarded as an error.

Figure 4:
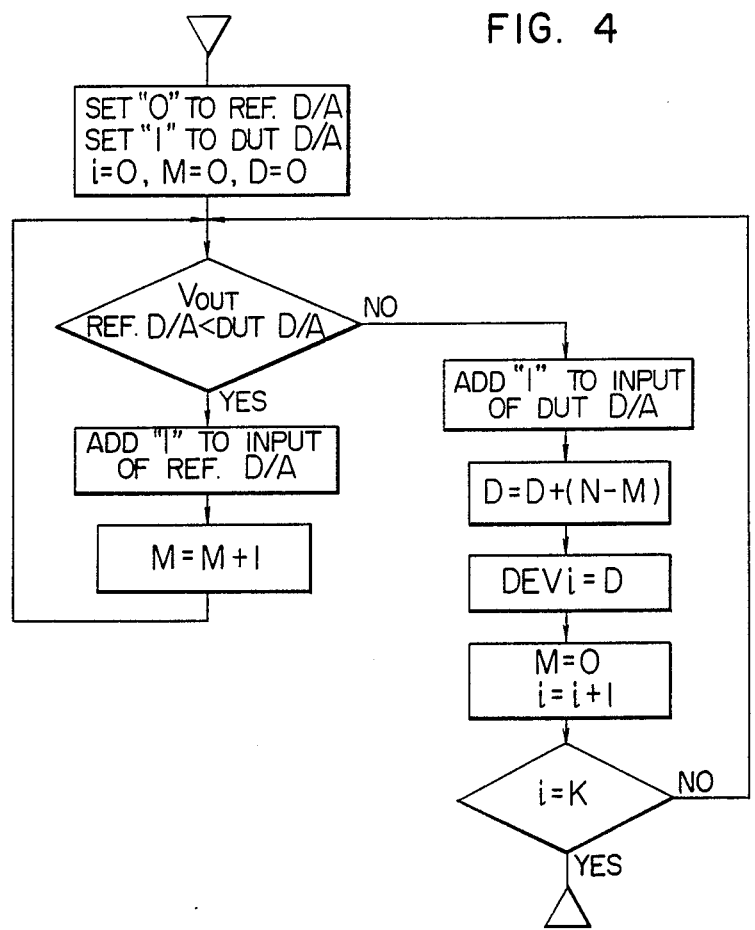
FIG. 4 shows a flow chart to illustrate the flow of operations executed by an external computer in carrying out the test of an analog/digital converter according to the invention.
Figure 5:
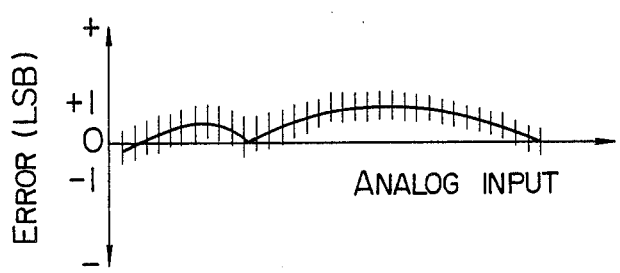
FIG. 5 graphically shows data concerning the conversion accuracy or precision characteristics obtained through the testing method of an analog/digital converter according to the invention.

Determination of the difference between the set values of both the D/A converters 4 and 14 and the ideal set value is performed by the external computer. In FIG. 4, there is shown a flow chart for illustrating the operation executed by the external computer for determining the difference in concern. As can be seen from FIG. 4, the digital set value $B_i$ of the reference D/A converter 14 is initially set at "0", while the digital set value $A_i$ of the D/A converter 4 under test is set to "1". Further, the number i of trial (or incremental) steps is set to zero, the number M representing the single bit width of the D/A converter 4 in terms of the bits of the reference D/A converter 14 is set to zero, and the deviation or difference D is set to zero. In this state, the output of the reference D/A converter 14 is compared with the output of the D/A converter 4 to be tested. It is assumed that the output of the reference D/A converter 14 is represented by REF while that of the D/A converter 4 is represented by DUT. So long as REF remains smaller than DUT (i.e. REF<DUT), the input $B_i$ to the reference D/A converter 14 is successively increased by unity or "1" with the number M being counted. When the output REF becomes greater than DUT (i.e. REF>DUT), the difference is determined between the count value M and the theoritical value N which corresponds to that count value M and is given by 2·(bit length of REF)/(bit length of DUT). The difference as determined is stored as the deviation or error. This process is repeated until the number i of trial steps is increased up to K which represents the full-scale factor. The differences obtained for each of the trial steps i are stored and displayed as an error curve representative of the non-linearity error or quantizing error, as is illustrated in FIG. 5.

As will be appreciated from the foregoing description, since the outputs of the D/A converter incorporated in the A/D converter and the reference D/A converter are compared with each other by making use of the voltage comparator also incorporated in the A/D converter for determining whether error is involved in the incorporated D/A converter, only one comparison operation is required for one digital input independent of the bit length of the A/D converter under test, whereby the time required for the measurement or test is shortened by the bit length (i.e. by a factor of 1/bit length) as compared with the hitherto known test method. For example, in the case of the A/D converter of 10-bit length, the test time cn be reduced to 1/10 of the time required for the test performed in accordance with the hitherto known method, to a great advantage for the test or measurement of high precision A/D converters of large bit lengths.

Further, because external circuits, such as an operational amplifier and the like, which are required for carrying out the hitherto known method and provide possible error sources are rendered unnecessary according to the invention, the measurement or test can be effected with a high accuracy.

Additionally, by virtue of such arrangement that the deviation or difference is processed as a digital signal by the externally provided computer, storage and conversion of relevant data can be realized in an extremely facilitated manner, providing another advantage.

Next, referring to FIG. 6, description will be made about how a GO/NO GO (passable or not passable) decision is made as to the characteristics of the A/D converter under test. In FIG. 6, a curve A represents the ideal conversion characteristic of the D/A converter incorporated in the A/D converter under test, while a curve B represents the conversion characteristic of the reference D/A converter. Assuming that criterion for deciding the conversion accuracy or precision for "GO" (passable) or "NO GO" (not passable) is, for example, based on ±1 LSB (least significant bit), the permissible upper and lower limit of the D/A converter incorporated in the A/D converter under test may be such as represented by straight lines C and D, respectively. On these conditions, the circuit arrangement may be made such that, for each of the set values $A_i$ of the D/A converter under test, the reference D/A converter produces voltages corresponding to the upper and the lower limit values of the analog voltage output from the incorporated D/A converter, wherein comparisons between the output voltages from the reference D/A converter and the incorporated D/A converter are effected by the incorporated voltage comparator. More specifically, referring to FIG. 6, it is assumed, by way of example, that the output voltage of the D/A converter under test is represented by $V_{a3}$ for the set value $A_i=3$. Then, the reference D/A converter is set at $B_i=13$ in correspondence to the upper limit value of the analog output voltage $V_{a3}$, to thereby produce a corresponding reference voltage represented by $V_{b3}$ (UPP). When it appears from the comparison that $V_{a3} \leq V_{b3}$ (UPP), a decision of "GO (passable)" is made. Otherwise, a decision of "NO GO (not passable)" is made. In a similar manner, for the lower limit value of the analog output voltage $V_{a3}$, the reference D/A converter is so set that $B_i=6$, to thereby produce a lower limit reference voltage $V_{b3}$ (LOW). When $V_{a3} \geq V_{b3}$ (LOW), a decision of "GO" is made. Otherwise, a decision of "NO GO" is made. Thus, when the decision of "GO" is made for both the upper and the lower limit values, it is determined that the error possibly involved by the A/D converter under test is of magnitude less than ±1 LSB.

The upper and the lower limit set values $B_i$(UPP) and $B_i$(LOW) of the reference A/D converter are definitely determined in correspondence to each of the digital input set values $A_i$ of the D/A converter to be tested. In the case of the example illustrated in FIG. 6, the upper limit set value of the reference A/D converter is given by $B_i$ (UPP)$=4A_i+1$ for the i-th digital set value $A_i$, while the lower limit set value $B_i$(LOW) is given by $B_i$ (LOW)$=4A_i-6$. In this manner, in the test of the D/A converter of n bits as to "GO (passable)" or "NO GO (not passable)", the conversion precision of all the conversion points can be completely tested through $2 \times 2^n$ comparisons independent of the resolution (or precision) of the measurements for the test.

We claim:

1. A method of measuring and testing the conversion precision of an analog/digital converter of the successive comparison type in which an analog conversion voltage of a digital/analog converter is successively compared with an analog input voltage by means of a voltage comparator to thereby produce a digital output signal, comprising the steps of:

producing a first digital signal for use in the test of said analog/digital converter;

supplying said first digital signal to the input of the digital/analog converter incorporated in the analog/digital converter under test to thereby convert said first digital signal into a first analog signal;

supplying a second digital signal, whose value is generally different from the value of said first digital signal, to the input of a reference digital/analog converter exhibiting an accurate conversion characteristic to thereby convert said second digital signal into a second analog signal;

comparing said first analog signal with said second analog signal by the comparator incorporated in said analog/digital converter there by producing a comparison signal indicative of whether or not one of said first and second analog signals is greater than the other;

changing stepwise the value of said second digital signal thereby changing stepwise the value of said second analog signal converted by said reference digital/analog converter;

repeating the step of comparing said first analog signal with said second analog signal with respect to each of the stepwisely changing values of said second analog signal until said comparison signal provides an indication different from the indication provided in the preceding comparing step; and determining the conversion characteristic of said analog/digital converter on the basis of the value of said second digital signal at which said comparison signal provides said different indication.

2. A method of measuring and testing the conversion precision of an analog/digital converter according to claim 1, wherein the number of bits of the digital signal supplied to said reference digital/analog converter is greater than the number of bits of the reference digital signal supplied to the digital/analog converter incorporated in the analog/digital converter under test.

3. A method of measuring and testing the conversion precision of an analog/digital converter of the successive comparison type in which an analog conversion voltage of a digital/analog converter is successively compared with an analog input voltage by means of a voltage comparator to thereby produce a digital output signal, comprising the steps of:

producing a first analog signal for use in the test of the analog/digital converter;

producing a digital signal which corresponds to said first analog signal;

supplying said digital signal corresponding to said first analog signal to the input of the digital/analog converter incorporated in the analog/digital converter under test to thereby convert said digital signal into a second analog signal;

comparing said first analog signal with said second analog signal by use of said voltage comparator incorporated in said analog/digital converter thereby producing a comparison signal indicative of whether or not one of said first and second analog signals is greater than the other;

changing stepwise the value of said digital signal thereby changing stepwise the value of said second analog signal converted by said reference digital/analog converter;

repeating the step of comparing said first analog signal with said second analog signal with respect to each of the stepwisely changing values of said second analog signal until said comparison signal provides an indication different from the indication provided in the preceding comparing step; and determining the conversion characteristic of said analog/digital converter on the basis of the value of said digital signal at which said comparison signal provides said different indication.

4. A method of measuring and testing the conversion precision of an analog/digital converter according to claim 3, wherein the number of bits of the ditial signal supplied to said reference digital/analog converter is greater than the number of bits of the digital signal supplied to the digital/analog converter incorporated in the analog/digital converter being tested.

5. An analog/digital converter having a structure suited for the measurement of the conversion accuracy thereof, comprising:

input terminal means to which an analog voltage signal to be converted is to be applied;

voltage comparator means for comparing analog signals applied to respective inputs thereof, one input being connected to receive the analog voltage signal applied to said input terminal means;

successive comparison register means for producing a digital signal which corresponds to the analog voltage signal applied to said input terminal means by varying successively a digital signal on the basis of the result obtained through the comparison effected by said voltage comparator means;

digital/analog converter means connected to said successive comparison register means and said voltage comparator means for receiving said digital signal outputted from said successive comparison register means and for producing an analog signal corresponding to said digital signal at the other input of said voltage comparator means;

output terminal means to which the digital signal outputted from said successive comparison register means is applied;

means for applying an externally supplied digital signal to a digital input of said digital/analog converter means during a test in lieu of the digital signal from said successive comparison register means; and means for selectively applying to a test output terminal the output signal from said voltage comparator means during the test in lieu of applying said output signal to said successive comparison register means.

6. An analog/digital converter according to claim 5, wherein said means for applying the output signal from said voltage comparator means to the test output terminal is constituted by controllable switching means connected between said voltage comparator means and said successive comparison register means for connecting the output of said voltage comparator means either to said succesive comparison register means or said test output terminal.

7. An analog/digital converter according to claim 5, wherein said means for applying the digital signal to the input of said digital/analog converter means is constituted by controllable switching means connected between said output terminal means and said digital-/analog converter means converting said output terminal means either to the output of said successive comparison register means or the input of said digital-/analog converter means.

8. An analog/digital converter according to claim 5, wherein said means for applying the output signal from said voltage comparator means to the test output terminal is constituted by first controllable switching means connected between said voltage comparator means and said successive comparison register means for connecting the output of said voltage comparator means either to said successive comparison register means or said test output terminal, and said means for applying the digital signal to the input of said digital/analog converter means is constituted by second controllable switching means connected between said output terminal means and said digital/analog converter means for connecting said output terminal means either to the output of said successive compariregister means to the input of said digital/analog converter means, said first and second controllable switching means being controlled by externally supplied switching control signals.

9. An analog/digital converter having a structure suited for measurement of the conversion accuracy thereof, comprising:

input terminal means to which an input analog voltage signal to undergo conversion is to be applied;

voltage comparator means for comparing analog signals applied to respective inputs thereof, one input being connected to receive the input analog voltage signal applied to said input terminal means;

successive comparison register means for varying successively a digital output signal thereof in dependence on an input signal thereto;

digital/analog converter means for converting a digital input signal to a corresponding analog voltage signal and for supplying said analog voltage signal to the other input of said voltage comparison means;

digital output terminal means for supplying a digital signal resulting from the analog/digital conversion of said input analog signal;

a test output terminal for supplying an output signal produced upon testing of the analog/digital converter;

a test control signal input terminal to which control signals are externally supplied during the test;

first switching means responsive to the control signals appearing at said test control signal input terminal for the output voltage signal from said voltage comparator means to said successive comparison register means as said input signal thereto or to said test output terminal as said output signal;

second switching means responsive to the control signal appearing at said test control signal input terminal for supplying the digital output signal of said successive comparison register means or an externally supplied digital signal to said digital-/analog converter means; and third switching means responsive to the control signal appearing at said test control signal input terminal for applying the digital output signal of said successive comparison register means to said digital output terminal means or for applying said externally supplied digital signal appearing at said digital output terminal means to said digital/analog converter means by way of said second switching means.

10. An analog/digital converter according to claim 9, further including register means connected between said second switching means and said third switching means for storing said digital signal supplied through said switching means.

* * * * *